(12) United States Patent
Ishida et al.

(10) Patent No.: US 7,772,636 B2
(45) Date of Patent: Aug. 10, 2010

(54) NONVOLATILE SEMICONDUCTOR MEMORY DEVICE WITH MULTILAYER INTERELECTRODE DIELECTRIC FILM

(75) Inventors: Hirokazu Ishida, Yokohama (JP); Masayuki Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/785,694

(22) Filed: Apr. 19, 2007

(65) Prior Publication Data

US 2007/0249120 A1    Oct. 25, 2007

(30) Foreign Application Priority Data

Apr. 21, 2006  (JP) .............................. 2006-118272

(51) Int. Cl.
*H01L 21/336* (2006.01)
(52) U.S. Cl. .................. 257/315; 257/E21.68; 438/261
(58) Field of Classification Search ................. 438/261; 257/315, E21.68
See application file for complete search history.

(56) References Cited

U.S. PATENT DOCUMENTS

| 5,304,829 | A | | 4/1994 | Mori et al. | |
| 5,661,056 | A | | 8/1997 | Takeuchi | |
| 5,729,035 | A | | 3/1998 | Anma | |
| 5,907,183 | A | * | 5/1999 | Takeuchi | 257/640 |
| 7,015,539 | B2 | | 3/2006 | Ozawa | |
| 2003/0102503 | A1 | * | 6/2003 | Rabkin et al. | 257/315 |
| 2004/0227179 | A1 | * | 11/2004 | Rabkin et al. | 257/315 |
| 2006/0051908 | A1 | * | 3/2006 | Ohtani et al. | 438/151 |
| 2006/0051921 | A1 | * | 3/2006 | Youn et al. | 438/257 |
| 2006/0068535 | A1 | * | 3/2006 | Youn et al. | 438/197 |
| 2006/0141711 | A1 | * | 6/2006 | Dong | 438/264 |

FOREIGN PATENT DOCUMENTS

| JP | 09-219459 | 8/1997 |
| JP | 2003-31705 | 1/2003 |
| JP | 2005-197363 A | 7/2005 |

OTHER PUBLICATIONS

Notification For Filing Opinion mailed Aug. 14, 2008, from the Korean Patent Office in corresponding Korean Application No. 10-2007-38646 and English translation thereof.

* cited by examiner

*Primary Examiner*—Hsien-ming Lee
*Assistant Examiner*—Kevin Parendo
(74) *Attorney, Agent, or Firm*—Finnegan, Henderson, Farabow, Garrett & Dunner, L.L.P.

(57) ABSTRACT

A nonvolatile semiconductor memory device includes a first dielectric layer formed on the major surface of a semiconductor substrate, a floating gate electrode layer formed on the first dielectric layer, a second dielectric layer obtained by sequentially forming, on the floating gate electrode layer, a lower dielectric film mainly containing silicon and nitrogen, an intermediate dielectric film, and an upper dielectric film mainly containing silicon and nitrogen, a control gate electrode layer formed on the second dielectric layer, and a buried dielectric layer formed by covering the two side surfaces in the gate width direction of the stacked structure including the above-mentioned layers. The nonvolatile semiconductor memory device further includes a silicon oxide film formed near the buried dielectric layer in the interface between the floating gate electrode layer and lower dielectric film.

14 Claims, 7 Drawing Sheets

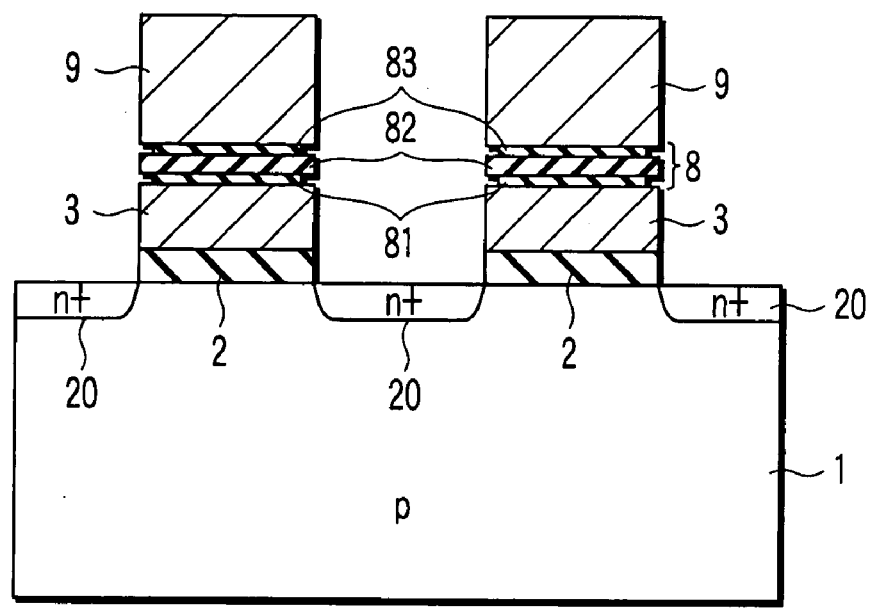
F I G. 11
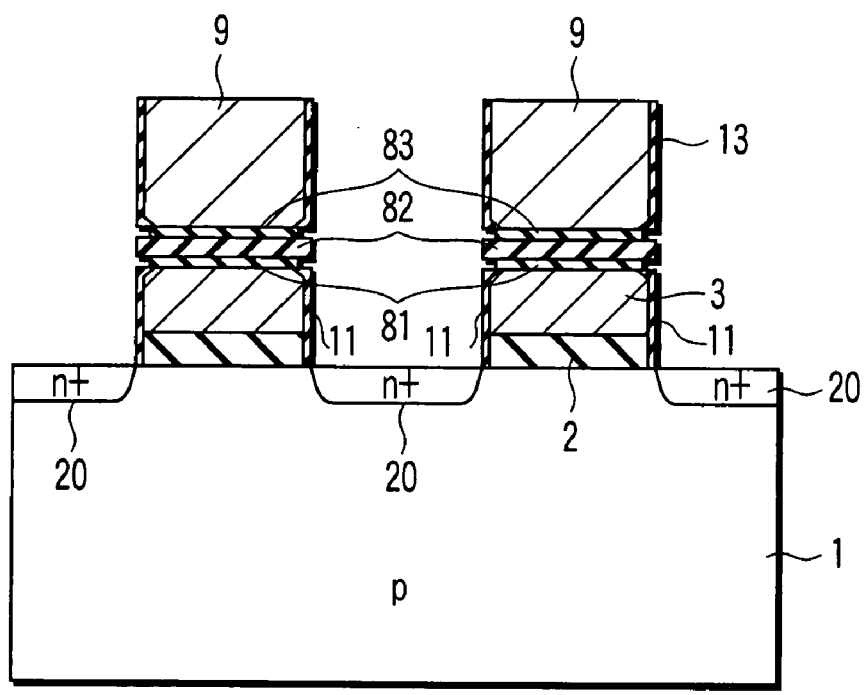
F I G. 12

NONVOLATILE SEMICONDUCTOR MEMORY DEVICE WITH MULTILAYER INTERELECTRODE DIELECTRIC FILM

CROSS-REFERENCE TO RELATED APPLICATIONS

This application is based upon and claims the benefit of priority from prior Japanese Patent Application No. 2006-118272, filed Apr. 21, 2006, the entire contents of which are incorporated herein by reference.

BACKGROUND OF THE INVENTION

1. Field of the Invention

The present invention relates to a nonvolatile semiconductor memory device and, more particularly, to a nonvolatile semiconductor memory device having a multilayered oxide and nitride film.

2. Description of the Related Art

Micropatterning of Nonvolatile Semiconductor memory elements poses the problem of an increase in interference between adjacent cells. This makes it necessary to decrease the thickness of a multilayered oxide and nitride film used as an interelectrode dielectric film. In addition, to reduce a leakage current that flows through the interelectrode dielectric film when its thickness decreases, a multilayered oxide and nitride film having nitride films in the upper and lower interfaces is already proposed.

In an dielectric film having oxide films in the upper and lower interfaces, it is possible by post oxidation after cell processing to reduce a leakage current caused by the damage during the processing, and a leakage current caused by a pointed end face of an electrode layer (e.g., Jpn. Pat. Appln. KOKAI Publication No. 2003-31705).

Unfortunately, in an interelectrode dielectric film having nitride films in the upper and lower interfaces (e.g., U.S. Pat. No. 5,661,056), the influences of the leakage current caused by the damage during the processing and the leakage current caused by the acute-angled electrode end face remain.

BRIEF SUMMARY OF THE INVENTION

According to a first aspect of the present invention, there is provided a nonvolatile semiconductor memory device comprising: a first dielectric layer formed on a major surface of a semiconductor substrate; a floating gate electrode layer formed on the first dielectric layer; a second dielectric layer obtained by sequentially forming, on the floating gate electrode layer, a lower dielectric film mainly containing silicon and nitrogen, an intermediate dielectric film, and an upper dielectric film mainly containing silicon and nitrogen; a control gate electrode layer formed on the second dielectric layer; a buried dielectric layer formed by covering two side surfaces in a gate width direction of a stacked structure including the first dielectric layer, the floating gate electrode layer, the second dielectric layer, and the control gate electrode layer; and a silicon oxide film formed near the buried dielectric layer in an interface between the floating gate electrode layer and the lower dielectric film.

According to a second aspect of the present invention, there is provided a nonvolatile semiconductor memory device comprising: a first dielectric layer formed on a major surface of a semiconductor substrate; a floating gate electrode layer formed on the first dielectric layer; a second dielectric layer obtained by sequentially forming, on the floating gate electrode layer, a lower dielectric film mainly containing silicon and nitrogen, an intermediate dielectric film, and an upper dielectric film mainly containing silicon and nitrogen; a control gate electrode layer formed on the second dielectric layer; a buried dielectric layer formed by covering two side surfaces in a gate width direction of a stacked structure including the first dielectric layer, the floating gate electrode layer, the second dielectric layer, and the control gate electrode layer; and a silicon oxide film formed near the buried dielectric layer in an interface between the control gate electrode layer and the upper dielectric film.

According to a third aspect of the present invention, there is provided a nonvolatile semiconductor memory device fabrication method comprising: forming a first dielectric layer on a major surface of a semiconductor substrate; forming a floating gate electrode layer on the first dielectric layer; etching two side surfaces in a gate length direction of each of the floating gate electrode layer and the first dielectric layer; covering, with an dielectric film, the two side surfaces in the gate length direction of the first dielectric layer and at least portions of the two side surfaces in the gate length direction of the floating gate electrode layer, thereby forming a buried dielectric layer having an upper surface positioned between an upper surface and a bottom surface of the floating gate electrode layer; forming a second dielectric layer on the floating gate electrode layer and the buried dielectric layer, comprising: forming a lower dielectric film mainly containing silicon and nitrogen; forming an intermediate dielectric film on the lower dielectric film; and forming an upper dielectric film mainly containing silicon and nitrogen on the intermediate dielectric film; forming a control gate electrode layer on the second dielectric layer; etching two side surfaces in a gate width direction of each of the first dielectric layer, the floating gate electrode layer, the second dielectric layer, and the control gate electrode layer, thereby forming isolation trenches; and forming, by oxidation, a first silicon oxide film near the isolation trench in an interface between the floating gate electrode layer and the lower dielectric film, and a second silicon oxide film near the isolation trench in an interface between the control gate electrode layer and the upper dielectric film.

BRIEF DESCRIPTION OF THE SEVERAL VIEWS OF THE DRAWING

FIG. 11 is a sectional view showing a fabrication step, that follows FIG. 7, of a nonvolatile semiconductor memory device according to the third embodiment;

FIG. 12 is a sectional view showing a nonvolatile semiconductor memory device fabrication step that follows FIG. 11.

DETAILED DESCRIPTION OF THE INVENTION

Figure 1:
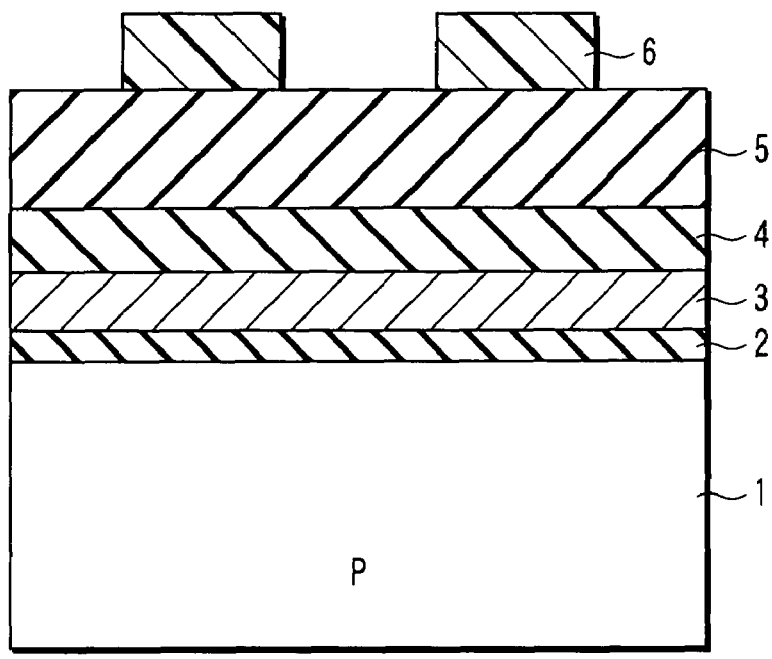
FIG. 1 is a sectional view showing a fabrication step of a nonvolatile semiconductor memory device according to the first embodiment.

Embodiments of the present invention will be explained in detail below with reference to the accompanying drawing. Note that in the following explanation, the same reference numerals denote elements having the same functions.

First Embodiment

FIGS. 1 to 8 are views showing fabrication steps of a nonvolatile semiconductor memory device according to the first embodiment of the present invention.

As shown in the sectional view of FIG. 1, a tunnel dielectric film 2 (first dielectric layer) about 1- to 15-nm-thick is first formed on the major surface of a p-type silicon substrate (or an n-type silicon substrate having a p-type well) 1. The tunnel dielectric film 2 is made of, e.g., a silicon thermal oxide film, a silicon nitride film, or a stacked film of these films.

On the tunnel dielectric film 2, a floating gate electrode layer 3 about 10- to 200-nm-thick made of polysilicon or the like is formed by chemical vapor deposition (CVD). The floating gate electrode layer 3 functions as a charge storage layer of a memory cell.

Then, a silicon nitride film 4 about 50- to 200-nm-thick is formed by CVD. In addition, a silicon oxide film 5 about 50- to 400-nm-thick is formed by CVD. The silicon oxide film 5 is coated with a photoresist 6. The structure shown in FIG. 1 is obtained by patterning the photoresist 6 by pattern exposure.

Figure 2:
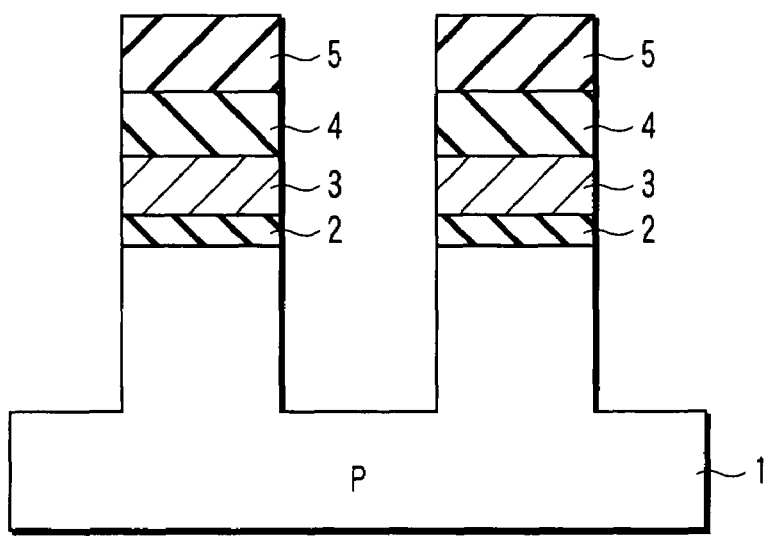
FIG. 2 is a sectional view showing a nonvolatile semiconductor memory device fabrication step that follows FIG. 1.
Figure 3:
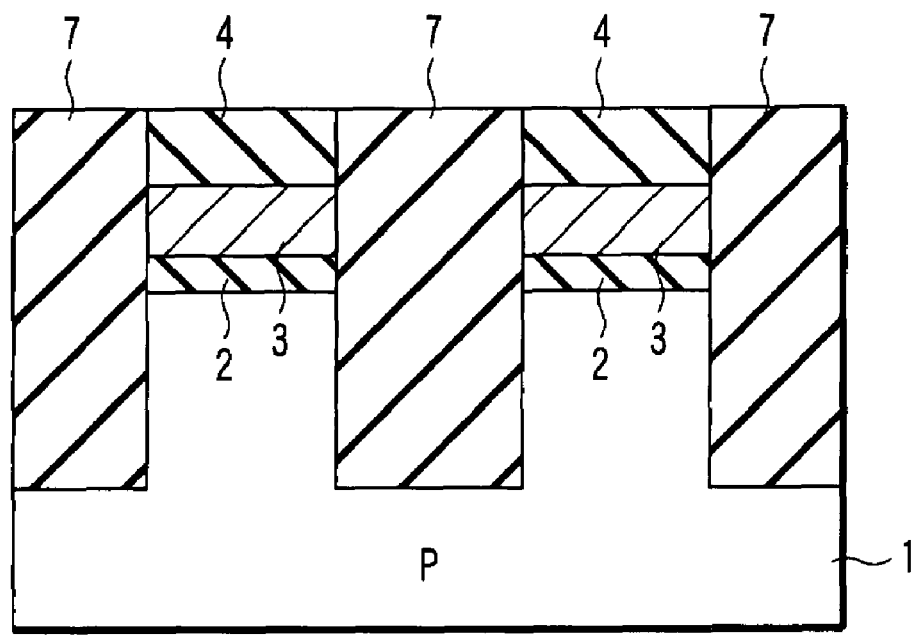
FIG. 3 is a sectional view showing a nonvolatile semiconductor memory device fabrication step that follows FIG. 2.

After that, the silicon oxide film 5 is etched by using the photoresist 6 shown in FIG. 1 as an anti-etching mask. The photoresist 6 is removed after the etching, and the silicon nitride film 4 is then etched by using the silicon oxide film 5 as a mask. In addition, the floating gate electrode layer 3, dielectric film 2, and silicon substrate 1 are sequentially etched to form trenches for isolation as shown in FIG. 2.

After that, a high-temperature post oxidation step is performed to remove the damage from the section formed by the etching. Subsequently, a 200- to 1,500-nm-thick buried dielectric film 7 such as a silicon oxide film is formed and buried in the isolation trenches. Furthermore, the density of the buried dielectric film 7 is increased by high-temperature annealing in a nitrogen or oxygen ambient. Planarization is then performed by chemical mechanical polishing (CMP) by using the silicon nitride film 4 as a stopper, thereby obtaining a structure shown in FIG. 3.

Figure 4:
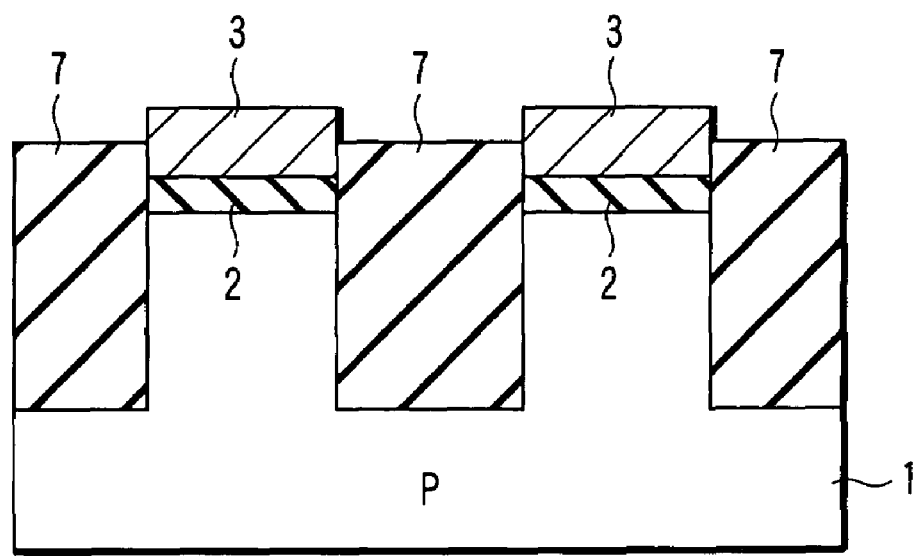
FIG. 4 is a sectional view showing a nonvolatile semiconductor memory device fabrication step that follows FIG. 3.

The silicon oxide film 7 (buried dielectric film) is etched by using a method capable of etching with selectivity to the silicon nitride film 4. This etching positions the upper surface of the silicon oxide film 7 between the upper surface and bottom surface of the floating gate electrode layer 3. In this embodiment, as shown in FIG. 4, the surface of the silicon oxide film 7 is etched away to a height corresponding to about half the film thickness of the floating gate electrode layer 3. A structure shown in FIG. 4 is obtained by removing the silicon nitride film 4 by a method having selectivity to the silicon oxide film 7.

Figure 5:
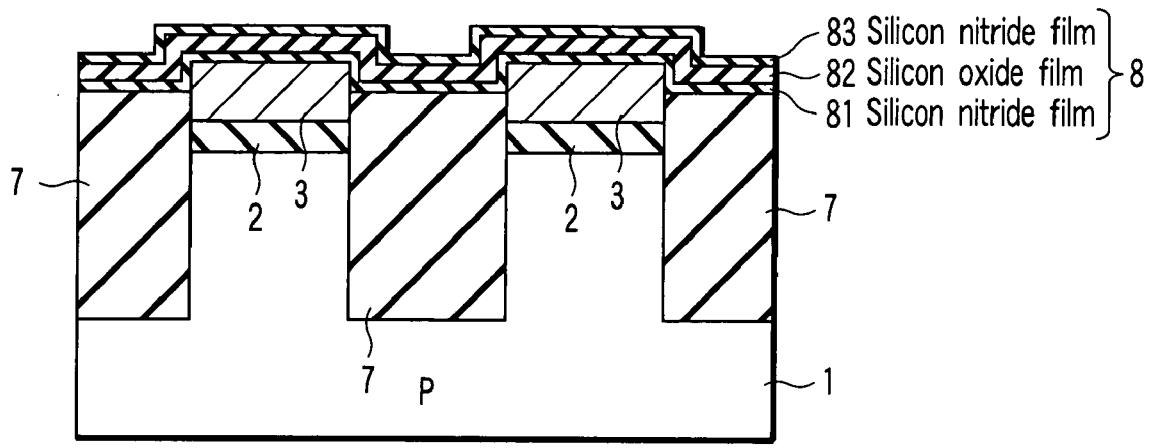
FIG. 5 is a sectional view showing a nonvolatile semiconductor memory device fabrication step that follows FIG. 4.

As shown in FIG. 5, an interelectrode dielectric film 8 (second dielectric layer) is formed on the lower layers having the structure shown in FIG. 4. The interelectrode dielectric film 8 is a multilayered dielectric film including three dielectric films 81 to 83. The structure shown in FIG. 5 is formed by the following procedure.

First, a silicon nitride film 81 (lower dielectric film) having a thickness of 0.5 to 10 nm is formed by CVD on the lower layers having the structure shown in FIG. 4. Then, a silicon oxide film 82 (intermediate dielectric film) having a thickness of 0.5 to 15 nm is formed on the silicon nitride film 81 by CVD. Finally, a silicon nitride film 83 (upper dielectric film) having a thickness of 0.5 to 10 nm is formed on the silicon oxide film 82 by CVD, thereby forming the interelectrode dielectric film 8 shown in FIG. 5.

Figure 6:
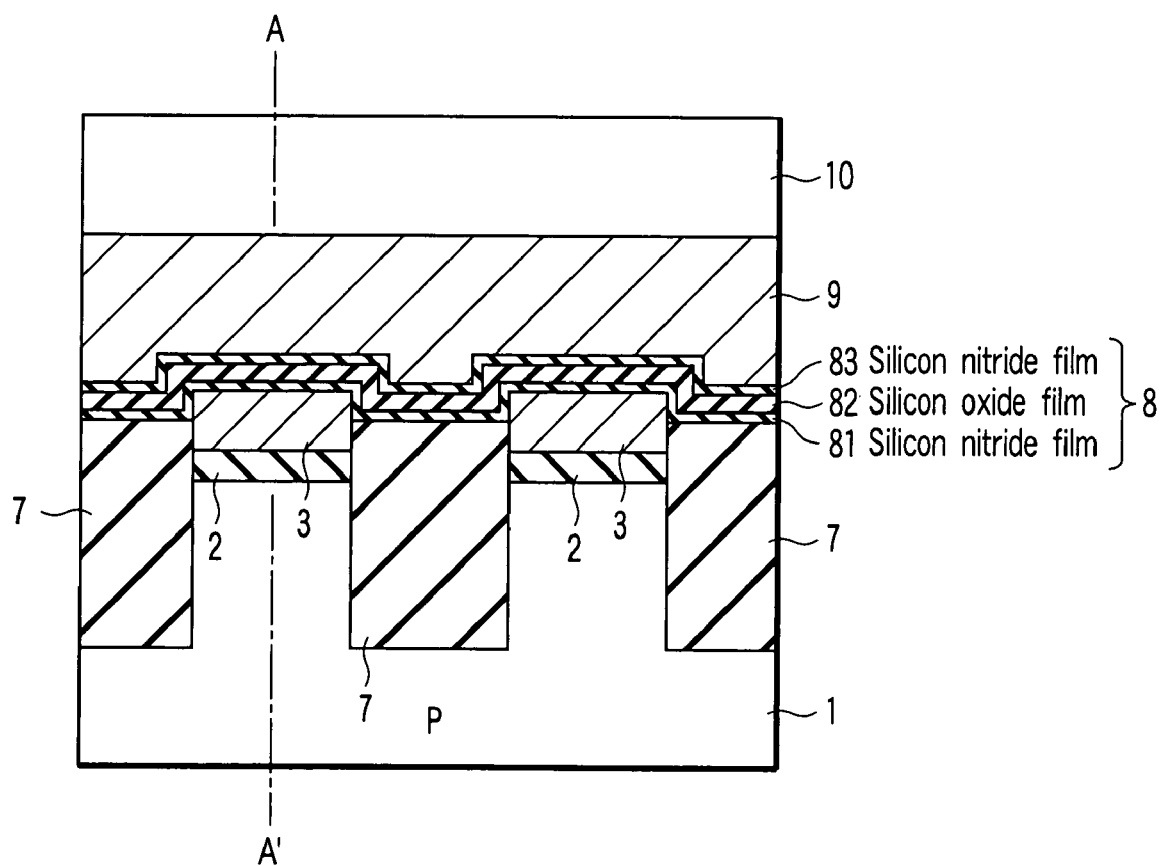
FIG. 6 is a sectional view showing a nonvolatile semiconductor memory device fabrication step that follows FIG. 5.

In addition, as shown in FIG. 6, a 10- to 200-nm-thick control gate electrode layer 9 made of, e.g., polysilicon is formed on the interelectrode dielectric film 8. The control gate electrode layer 9 functions as a control electrode in the nonvolatile semiconductor memory device. A sectional structure shown in FIG. 6 is obtained by forming a mask material 10 on the control gate electrode layer 9.

After that, the mask material 10 is coated with a resist (not shown), and the resist is patterned by pattern exposure. This resist is used as a mask to etch away the mask material 10, control gate electrode layer 9, interelectrode dielectric film 8 (second dielectric layer), floating gate electrode layer 3, and first dielectric layer 2 (this step is not shown).

Figure 7:
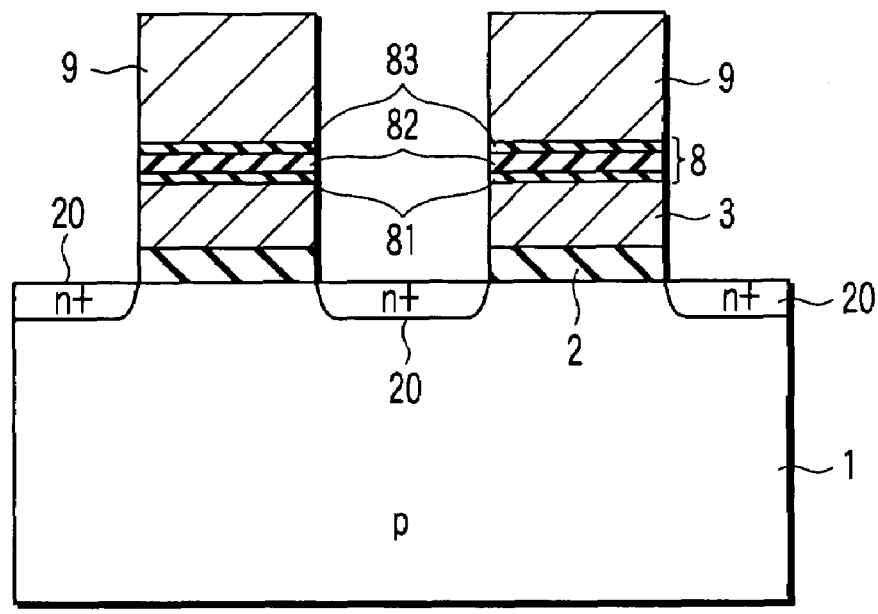
FIG. 7 is a sectional view taken along a line A-A' in FIG. 6 and showing a nonvolatile semiconductor memory device fabrication step that follows FIG. 6.

The resist and mask material 10 are then removed to obtain a structure shown in FIG. 7, as a sectional view taken along a line A-A' in FIG. 6 and perpendicular to the drawing surface. Source and drain regions 20 are formed by ion implantation in the surface of the substrate 1 as the bottom portions of the etched regions (isolation trenches) shown in FIG. 7.

Figure 8:
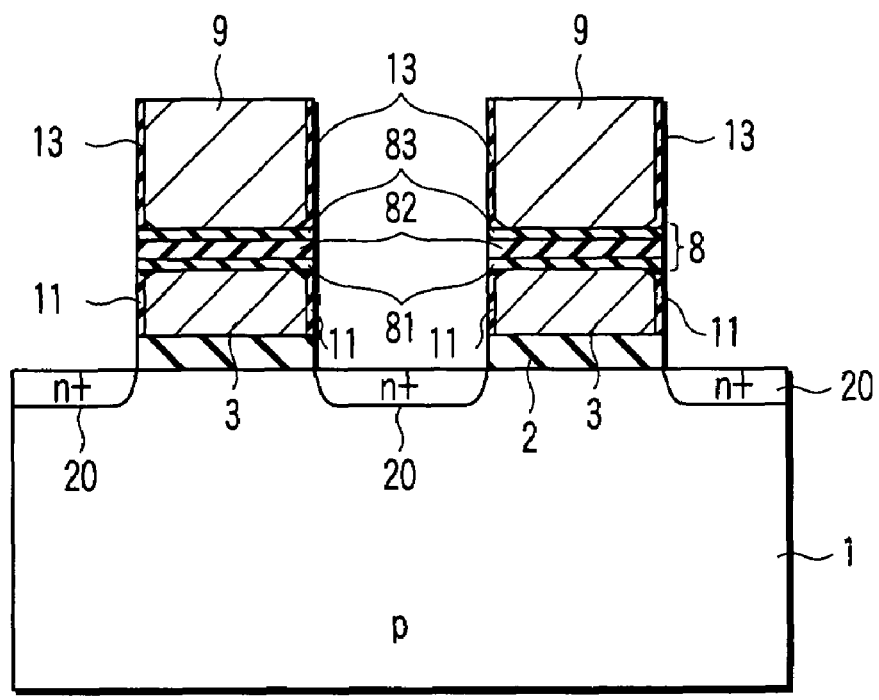
FIG. 8 is a sectional view showing a nonvolatile semiconductor memory device fabrication step that follows FIG. 7.

In this state, an oxidation process is performed in a steam ambient at 750° C. for an oxidation time of 30 min. This forms interface oxide films as shown in FIG. 8. That is, a silicon oxide film 11 is formed on the sidewall surfaces of the etched floating gate electrode layer 3, and on those portions of the interface, which continue from the above-mentioned sidewall surfaces, between the floating gate electrode layer 3 and interelectrode dielectric film 8 (i.e., the silicon nitride film 81). Also, a silicon oxide film 13 is formed on the sidewall surfaces of the etched control gate electrode layer 9, and on those portions of the interface, which continue from the above-mentioned sidewall surfaces, between the control gate electrode layer 9 and interelectrode dielectric film 8 (i.e., the silicon nitride film 83).

By performing the oxidation process under the oxidizing conditions with a high oxidizing power in the presence of steam as in this embodiment, it is possible to oxidize the floating gate electrode layer 3 from both sides along the interface between the floating gate electrode layer 3 and interelectrode dielectric film 8, and simultaneously oxidize the control gate electrode layer 9 from both sides along the interface between the control gate electrode layer 9 and interelectrode dielectric film 8. This rounds the corners along the gate width direction of the floating gate electrode layer 3 and control gate electrode 9, and makes it possible to recover the damage caused by mixing of ions and the like during the etching. Consequently, the leakage current can be reduced.

In this case, the silicon oxide film 11 penetrates between the floating gate electrode layer 3 and silicon nitride film 81 from both sides, and the silicon oxide film 13 penetrates between the control gate electrode layer 9 and silicon nitride film 83 from both sides. To effectively reduce the leakage current caused via the corners of the floating gate electrode layer 3 and control gate electrode layer 9, the length of penetration of the silicon oxide films 11 and 13 measured in the gate length direction from the sidewalls of the floating gate electrode layer 3 and control gate electrode layer 9 is desirably 5% or more of the film thickness of the interelectrode dielectric film 8.

On the other hand, from the viewpoint of the coupling ratio (C1/(C1+C2)) defined by the capacitance (C1) of the interelectrode dielectric film 8 and the capacitance (C2) of the tunnel dielectric film 2, the coupling ratio decreases as the penetration length described above increases. This is so because when the penetration length increases, both the contact area between the floating gate electrode layer 3 and interelectrode dielectric film 8 and the contact area between the control gate electrode layer 9 and interelectrode dielectric film 8 reduce, and this decreases the capacitance of the interelectrode dielectric film 8.

To suppress the fluctuation from the desired coupling ratio to 5% or less, therefore, the penetration length is desirably 4% or less of the cell length, i.e., the width in the gate length direction of the floating gate electrode layer 3 or control gate electrode layer 9.

Note that the oxidation process may also be performed not in the steam ambient but by plasma oxidation at a temperature of about 400° C.

Figure 9:
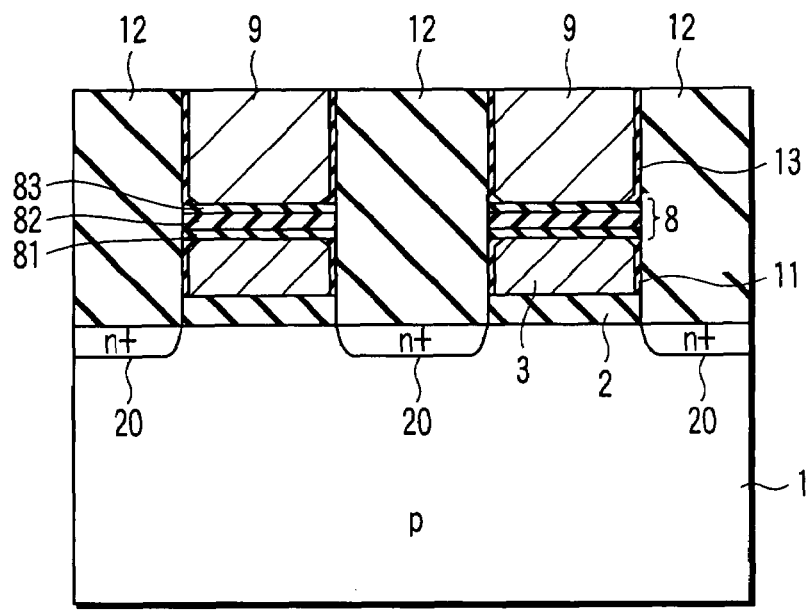
FIG. 9 is a sectional view showing the nonvolatile semiconductor memory device according to the first and second embodiments.

Subsequently, as shown in FIG. 9, a 200- to 1,500-nm-thick buried dielectric film 12 (buried dielectric layer) for isolation made of a silicon oxide film or the like is formed and buried in the isolation trenches. After that, a high-temperature annealing step is performed in a nitrogen or oxygen ambient to increase the density of the buried dielectric film 12. Planarization is then performed by chemical mechanical polishing (CMP) by using the control gate electrodes 9 as stoppers.

Consequently, as shown in FIG. 9, a silicon oxide film 11 is formed near the buried dielectric film 12 in the interface between the floating gate electrode layer 3 and silicon nitride film 81, and a silicon oxide film 13 is formed near the buried dielectric film 12 in the interface between the control gate electrode layer 9 and silicon nitride film 83.

If no interface oxide films are formed and the corners along the gate width direction of the floating gate electrode layer 3 and control gate electrode layer 9 are close to the right angle, an electric field concentrates to these corners to allow a leakage current to readily flow through the interelectrode dielectric film 8. However, when the silicon oxide films 11 and 13 are formed as in this embodiment, the corners of the floating gate electrode layer 3 and control gate electrode layer 9 can be rounded. Since this makes it possible to alleviate the field concentration near the corners, the leakage current can be reduced.

Figure 10:
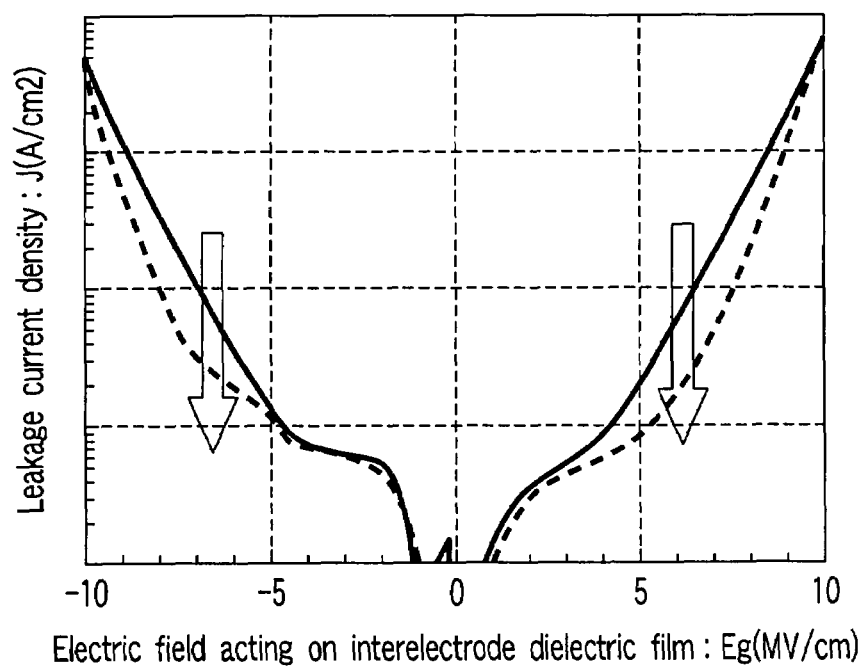
FIG. 10 is a graph showing the current densities of leakage currents that flow through an interelectrode dielectric film when interface oxide films are formed and no interface oxide films are formed.

FIG. 10 shows the current densities of leakage currents that flow through the interelectrode dielectric film when no interface oxide films are formed and interface oxide films are formed as in this embodiment. As shown in FIG. 10, the formation of the interface oxide films reduces the leakage current.

In this embodiment, the interelectrode dielectric film 8 has the three-layered structure including silicon nitride film-silicon oxide film-silicon nitride film (NON). However, the interelectrode dielectric film 8 is not limited to this structure. For example, the same effects as in the above embodiment can be obtained by a silicon nitride film-silicon oxide film-silicon nitride film-silicon oxide film-silicon nitride film (NONON) five-layered structure in which the silicon oxide film as an intermediate dielectric film in the center of the three-layered structure has an ONO structure including silicon oxide film-silicon nitride film-silicon-oxide film. Since a silicon nitride film traps electric charge, this structure can further reduce the leakage current flowing through the interelectrode dielectric film.

Second Embodiment

Fabrication steps of a nonvolatile semiconductor memory device according to the second embodiment of the present invention will be explained below.

In this embodiment, the structure shown in FIG. 7 is formed by the same steps as in the first embodiment. This embodiment further ion-implants phosphorus (P) in memory cell regions of the structure shown in FIG. 7 in which source and drain regions 20 are already formed by ion implantation. In this ion implantation, phosphorus ions may also be implanted in, e.g., an oblique direction so as to be readily implanted into silicon nitride films 81 and 83 from the sidewalls.

After that, an oxidation process is performed in an oxygen ambient at 850° C. for an oxidation time of 30 min, thereby obtaining the same structure as in the first embodiment shown in FIG. 8.

Oxidation performed after phosphorus is ion-implanted into the silicon nitride films 81 and 83 as in this embodiment promotes oxidation of the silicon nitride films 81 and 83 that originally hardly oxidize. This accelerates penetration in the gate length direction of a silicon oxide film 11 into the interface between a floating gate electrode layer 3 and interelectrode dielectric film 8 (i.e., the silicon nitride film 81), and penetration in the gate length direction of a silicon oxide film 13 into the interface between a control gate electrode layer 9 and the interelectrode dielectric film 8 (i.e., the silicon nitride film 83).

This embodiment can also round the corners in the gate width direction of the floating gate electrode layer 3 and control gate electrode layer 9, and recover the damage caused by mixing of ions and the like during etching, thereby reducing the leakage current. Steps to FIG. 9 after that are the same as in the first embodiment.

To effectively reduce the leakage current caused via the corners of the floating gate electrode layer 3 and control gate electrode layer 9, the length of penetration of the silicon oxide films 11 and 13 measured from the sidewalls of the floating gate electrode layer 3 and control gate electrode layer 9 is desirably 5% or more of the film thickness of the interelectrode dielectric film 8, in this embodiment as well.

On the other hand, to suppress the fluctuation from the desired coupling ratio to 5% or less, the penetration length is desirably 4% or less of the cell length, i.e., the width in the gate length direction of the floating gate electrode layer 3 or control gate electrode layer 9.

Note that the oxidation process may also be performed not under the above-mentioned conditions but by plasma oxidation at a temperature of about 400° C.

The interelectrode dielectric film 8 is not limited to the three-layered structure including silicon nitride film-silicon oxide film-silicon nitride film (NON) in this embodiment as well. For example, the same effects as in the above embodiment can be obtained by a silicon nitride film-silicon oxide film-silicon nitride film-silicon oxide film-silicon nitride film (NONON) five-layered structure in which the silicon oxide film as an intermediate dielectric film in the center of the three-layered structure has an ONO structure including silicon oxide film-silicon nitride film-silicon oxide film. Since a silicon nitride film traps electric charge, this structure can further reduce the leakage current flowing through the interelectrode dielectric film.

Third Embodiment

Fabrication steps of a nonvolatile semiconductor memory device according to the third embodiment of the present invention will be explained below.

This embodiment also forms the structure shown in FIG. 7 by the same steps as in the first embodiment. In the structure shown in FIG. 7, however, this embodiment performs wet etching on silicon nitride films 81 and 83 by using a phosphoric acid solution, thereby obtaining a structure shown in FIG. 11.

As shown in FIG. 11, this wet etching partially removes one or both of the silicon nitride films 81 and 83 in the gate length direction, thereby making the width in the gate length direction smaller than that in the gate length direction of a floating gate electrode layer 3 or control gate electrode layer 9.

After that, an oxidation process is performed in an oxygen ambient at 850° C. for an oxidation time of 30 min. This oxidation process forms interface oxide films as shown in FIG. 12. That is, a silicon oxide film 11 is formed on the sidewall surfaces of the floating gate electrode layer 3 that is etched by etching for forming isolation trenches, and on those portions of the interface, which continue from the above-mentioned sidewall surfaces, between the floating gate electrode layer 3 and an interelectrode dielectric film 8 (i.e., the silicon nitride film 81). Also, a silicon nitride film 13 is formed on the sidewall surfaces of the control gate electrode layer 9 that is similarly etched, and on those portions of the interface, which continue from the above-mentioned sidewall surfaces, between the control gate electrode layer 9 and interelectrode dielectric film 8 (i.e., the silicon nitride film 83).

Note that as shown in FIG. 12, the width of the removal of the silicon nitride films 81 and 83 by the wet etching described above is desirably larger than the film thickness of the silicon oxide films 11 and 13 respectively formed on the sidewall surfaces of the floating gate electrode layer 3 and control gate electrode layer 9.

The floating gate electrode layer 3 and control gate electrode layer 9 are exposed by etching the silicon nitride films 81 and 83 by using a phosphoric acid solution as in this embodiment. It is possible via oxidation of the exposed surfaces to accelerate oxidation of the floating gate electrode layer 3 from both sides along the interface between the floating gate electrode layer 3 and interelectrode dielectric film 8 (silicon nitride film 81), and oxidation of the control gate electrode layer 9 from both sides along the interface between the control gate electrode layer 9 and interelectrode dielectric film 8 (silicon nitride film 83).

That is, it is possible to promote penetration in the gate length direction of the silicon oxide film 11 in the interface between the floating gate electrode layer 3 and silicon nitride film 81, and penetration in the gate length direction of the silicon oxide film 13 in the interface between the control gate electrode layer 9 and silicon nitride film 83.

Consequently, as shown in FIG. 12, the silicon oxide films 11 and 13 penetrate to portions deeper than the sidewalls of the silicon nitride films 81 and 83 partially removed by wet etching.

This interface oxidation rounds the corners of the floating gate electrode layer 3 and control gate electrode layer 9, and can also recover the damage caused by mixing of ions and the like during etching, thereby reducing the leakage current.

To effectively reduce the leakage current caused via the corners of the floating gate electrode layer 3 and control gate electrode layer 9, the length of penetration of the silicon oxide films 11 and 13 measured from the sidewalls of the floating gate electrode layer 3 and control gate electrode layer 9 is desirably 5% or more of the film thickness of the interelectrode dielectric film 8, in this embodiment as well.

On the other hand, to suppress the fluctuation from the desired coupling ratio to 5% or less, the penetration length is desirably 4% or less of the cell length, i.e., the width in the gate length direction of the floating gate electrode layer 3 or control gate electrode layer 9.

Note that the oxidation process may also be performed not under the above-mentioned conditions but by plasma oxidation at a temperature of about 400° C.

Figure 13:
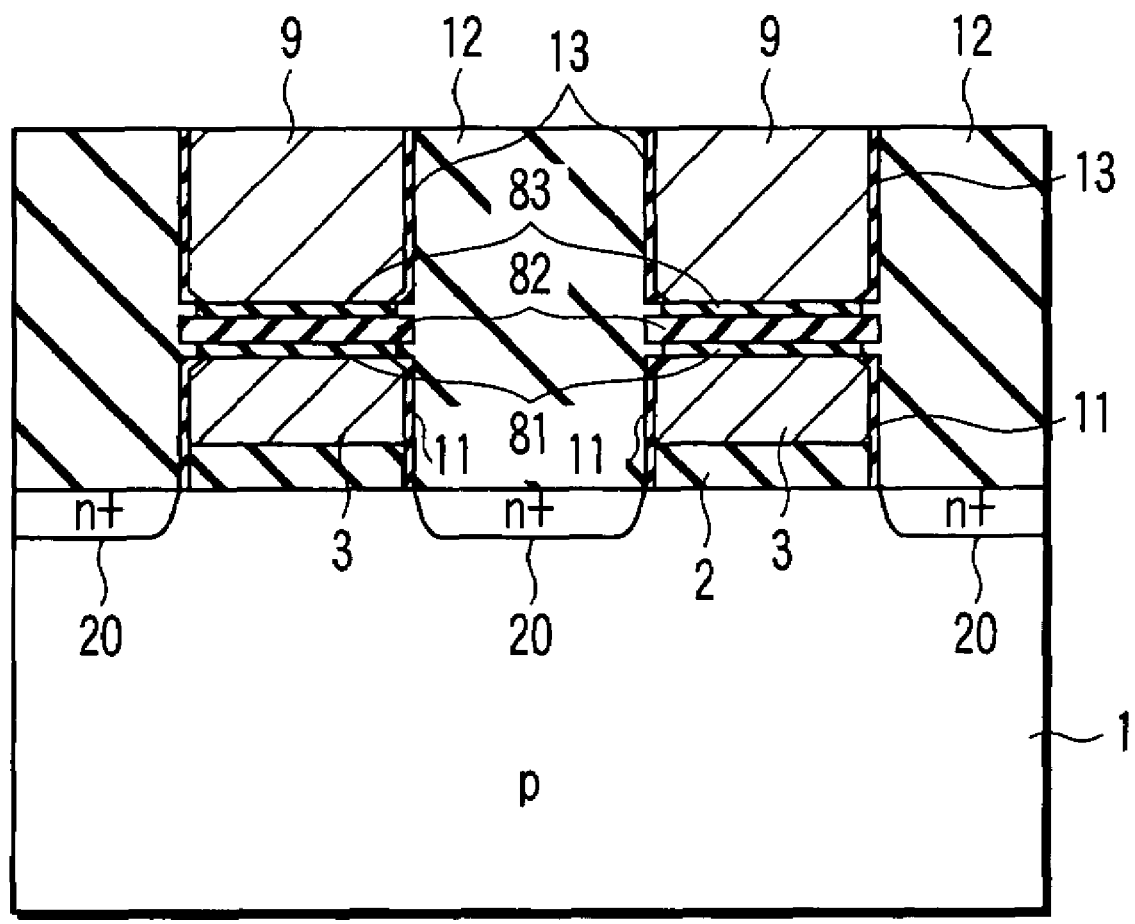
FIG. 13 is a sectional view showing the nonvolatile semiconductor memory device according to the third embodiment.

Subsequently, as shown in FIG. 13, a 200- to 1,500-nm-thick buried dielectric film 12 for isolation made of a silicon oxide film or the like is formed and buried in the isolation trenches. After that, a high-temperature annealing step is performed in a nitrogen or oxygen ambient to increase the density of the buried dielectric film 12. Planarization is then performed by chemical mechanical polishing (CMP) by using the control gate electrodes 9 as stoppers.

Consequently, as shown in FIG. 13, a silicon oxide film 11 is formed near the buried dielectric film 12 in the interface between the floating gate electrode layer 3 and silicon nitride film 81, and a silicon oxide film 13 is formed near the buried dielectric film 12 in the interface between the control gate electrode layer 9 and silicon nitride film 83.

It is conventionally difficult to recover the damage inflicted on the sidewalls of the silicon nitride films 81 and 83 by etching. However, this embodiment can remove the damaged portions that produce a leakage current, by wet-etching the sidewalls of the silicon nitride films 81 and 83. This can also reduce the leakage current.

The interelectrode dielectric film 8 is not limited to the three-layered structure including silicon nitride film-silicon oxide film-silicon nitride film (NON) in this embodiment as well. For example, the same effects as in the above embodiment can be obtained by a silicon nitride film-silicon oxide film-silicon nitride film-silicon oxide film-silicon nitride film (NONON) five-layered structure in which the silicon oxide film as an intermediate dielectric film in the center of the three-layered structure has an ONO structure including silicon oxide film-silicon nitride film-silicon oxide film. Since a silicon nitride film traps electric charge, this structure can further reduce the leakage current flowing through the interelectrode dielectric film.

One aspect of the present invention can provide a nonvolatile semiconductor memory device that reduces a leakage current flowing through an interelectrode dielectric film, particularly, an interelectrode dielectric film having silicon nitride films in the upper and lower interfaces.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
a plurality of stacked structures, each including:
a first dielectric layer formed on a major surface of a semiconductor substrate,
a floating gate electrode layer formed on the first dielectric layer, the floating gate electrode layer including first portions positioned at top corner portions of the floating gate electrode layer and a second portion positioned at a top of the floating gate electrode layer, a second dielectric layer obtained by sequentially forming, on the floating gate electrode layer, a lower dielectric film mainly containing silicon and nitrogen, an intermediate dielectric film, and an upper dielectric film mainly containing silicon and nitrogen, and a control gate electrode layer formed on the second dielectric layer;

a buried dielectric layer buried among a plurality of the stacked structures and buried up to a top surface of the control gate electrode layer; and a plurality of silicon oxide films, each silicon oxide film having a first member, which is an upper corner portion of one of the silicon oxide films and which is formed between one of the first portions of the floating gate electrode layer and the lower dielectric film and a second member sandwiched between a side wall of the floating gate electrode layer and a side wall of the buried dielectric layer, each silicon oxide film being not provided on the entire second portion of the floating gate electrode layer, the first member of each silicon oxide film being a continuation of the second member of each silicon oxide film.

2. A nonvolatile semiconductor memory device comprising:

a plurality of stacked structures, each including:

a first dielectric layer formed on a major surface of a semiconductor substrate, a floating gate electrode layer formed on the first dielectric layer, a second dielectric layer obtained by sequentially forming, on the floating gate electrode layer, a lower dielectric film mainly containing silicon and nitrogen, an intermediate dielectric film, and an upper dielectric film mainly containing silicon and nitrogen, and a control gate electrode layer formed on the second dielectric layer, the control gate electrode layer including a plurality of first portions positioned at lower corner portions of the control gate electrode layer and a second portion positioned at a bottom of the control gate electrode layer;

a buried dielectric layer buried among the plurality of the stacked structures and buried up to a top surface of the control gate electrode layer; and a plurality of silicon oxide films, each silicon oxide film having a first member, which is a bottom corner portion of one of the silicon oxide films and which is formed between one of the first portions of the control gate electrode layer and the upper dielectric film and a second member sandwiched between a side wall of the control gate electrode layer and a side wall of the buried dielectric layer, each silicon oxide film being not provided on the entire second portion of the control gate electrode layer, the first member of each silicon oxide film being a continuation of the second member of each silicon oxide film.

3. A device according to claim 1, wherein the first portions of the floating gate electrode layer, which are formed along the floating gate width direction and are in contact with the silicon oxide film, are rounded.

4. A device according to claim 2, wherein the first portions of the control gate electrode layer, which are formed along the control gate width direction and are in contact with the silicon oxide film, are rounded.

5. A device according to claim 1, wherein the intermediate dielectric film is one of a silicon oxide film and a multilayered film, wherein the multilayered film is obtained by sequentially forming a silicon oxide film, a dielectric film mainly containing silicon and nitrogen, and another silicon oxide film.

6. A device according to claim 2, wherein the intermediate dielectric film is one of a silicon oxide film and a multilayered film, wherein the multilayered film is obtained by sequentially forming a silicon oxide film, a dielectric film mainly containing silicon and nitrogen, and another silicon oxide film.

7. A device according to claim 1, wherein a width of the silicon oxide film formed an interface in between the first portion of the floating gate electrode layer and the lower dielectric film is not less than 5% of a film thickness of the second dielectric layer.

8. A device according to claim 2, wherein a width of the silicon oxide film formed an interface in between the first portion of the control gate electrode layer and the upper dielectric film is not less than 5% of a film thickness of the second dielectric layer.

9. A device according to claim 1, a width of the silicon oxide film formed an interface in between the first portion of the floating gate electrode layer and the lower dielectric film is not more than 4% of a width in a gate length direction of the floating gate electrode layer.

10. A device according to claim 2, wherein a width of the silicon oxide film formed an interface in between the first portion of the control gate electrode layer and the upper dielectric film is not more than 4% of a width in a gate length direction of the control gate electrode layer.

11. A device according to claim 1, wherein a width of the lower dielectric film in a gate length direction is smaller than a width of the floating gate electrode layer in the gate length direction.

12. A device according to claim 2, wherein a width of the upper dielectric film in a gate length direction is smaller than a width of the control gate electrode layer in the gate length direction.

13. A device according to claim 1, wherein the silicon oxide film penetrates to a portion deeper than a sidewall of the lower dielectric film.

14. A device according to claim 2, wherein the silicon oxide film penetrates to a portion deeper than a sidewall of the upper dielectric film.

* * * * *

UNITED STATES PATENT AND TRADEMARK OFFICE
CERTIFICATE OF CORRECTION

PATENT NO. : 7,772,636 B2  Page 1 of 1
APPLICATION NO. : 11/785694
DATED : August 10, 2010
INVENTOR(S) : Ishida et al.

It is certified that error appears in the above-identified patent and that said Letters Patent is hereby corrected as shown below:

Claim 7, column 10, line 22, change "formed an interface in between" to --formed in an interface between--.

Claim 8, column 10, line 27, change "formed an interface in between" to --formed in an interface between--.

Claim 9, column 10, line 32, change "formed an interface in between" to --formed in an interface between--.

Claim 10, column 10, line 37, change "formed an interface in between" to --formed in an interface between--.

Signed and Sealed this

Ninth Day of November, 2010

David J. Kappos
*Director of the United States Patent and Trademark Office*